(12) United States Patent
Son et al.

(10) Patent No.: US 9,007,802 B2
(45) Date of Patent: Apr. 14, 2015

(54) E-FUSE ARRAY CIRCUIT

(75) Inventors: Sungju Son, San Jose, CA (US);
Youncheul Kim, San Jose, CA (US);
Sungho Kim, Icheon-si (KR); Dongue Ko, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 319 days.

(21) Appl. No.: 13/610,451

(22) Filed: Sep. 11, 2012

(65) Prior Publication Data

US 2014/0071779 A1 Mar. 13, 2014

(51) Int. Cl.
*G11C 17/18* (2006.01)
*G11C 17/04* (2006.01)
*G11C 17/16* (2006.01)

(52) U.S. Cl.
CPC ............... *G11C 17/18* (2013.01); *G11C 17/04* (2013.01); *G11C 17/16* (2013.01)

(58) Field of Classification Search
CPC ...... G11C 17/16; G11C 17/04; H01L 27/112; H01L 27/11206

USPC ...................................................... 365/96, 94
See application file for complete search history.

(56) References Cited

U.S. PATENT DOCUMENTS

| | | | |
|---|---|---|---|
| 5,909,049 A * | 6/1999 | McCollum | 257/530 |
| 6,927,474 B1 * | 8/2005 | O'Connell et al. | 257/530 |
| 7,269,047 B1 | 9/2007 | Fong et al. | |
| 7,436,028 B2 * | 10/2008 | Yang et al. | 257/368 |
| 7,623,368 B2 * | 11/2009 | Luan | 365/104 |
| 2004/0004269 A1 * | 1/2004 | Fifield et al. | 257/530 |
| 2007/0152338 A1 * | 7/2007 | Kim | 257/758 |
| 2011/0116299 A1 * | 5/2011 | Obayashi | 365/96 |

* cited by examiner

*Primary Examiner* — Douglas King
(74) *Attorney, Agent, or Firm* — IP & T Group LLP

(57) ABSTRACT

An e-fuse array circuit includes a program gate line and a word line gate line that are stretched in parallel to each other, and a metal line formed over the program gate line and the word line gate line to cover the program gate line and the word line gate line, the metal line connected to the program gate line through a plurality of contact plugs disposed at a given distance.

6 Claims, 5 Drawing Sheets

E-FUSE ARRAY CIRCUIT

BACKGROUND

1. Field

Exemplary embodiments of the present invention relate to an e-fuse array circuit, and more particularly, to a structure of an e-fuse array circuit.

2. Description of the Related Art

A general fuse recognizes a data based on whether a fuse is cut or not by a laser. Therefore, a fuse may be programmed in the stage of wafer, but the fuse cannot be programmed once the wafer is mounted in the inside of a package.

To overcome this concern, an e-fuse is used. An e-fuse stores a data by using a transistor and changing the resistance between a gate and a drain/source.

FIG. 1 is schematic diagram illustrating an e-fuse formed of a transistor, the e-fuse operating as a resistor or a capacitor.

Referring to FIG. 1, the e-fuse is formed of a transistor T, and a power source voltage is supplied to a gate G while a ground voltage is supplied to a drain/source D/S.

When a general power source voltage that the transistor T may tolerate is supplied to the gate G, the e-fuse operates as a capacitor C. Therefore, no current flows between the gate G and the drain/source D/S. When a high power source voltage that the transistor T may not tolerate is supplied to the gate G, a gate oxide of the transistor T is destroyed to short the coupling between the gate G and the drain/source D/S and the e-fuse operates as a resistor R. Therefore, current flows between the gate G and the drain/source D/S. By taking advantage of these results, data of the e-fuse may be recognized from the resistance value between the gate G and the drain/source D/S of the e-fuse. The data of the e-fuse may be recognized by 1) enlarging the size of the transistor T without additionally performing a sensing operation, or by 2) using an amplifier and sensing the current flowing through the transistor T instead of increasing the size of the transistor T. The two methods, however, have a concern regarding dimensional restriction because the size of the transistor T has to be enlarged or an amplifier for amplifying a data has to be added to each e-fuse.

U.S. Pat. No. 7,269,047 discloses a method for decreasing the space occupied by an e-fuse by forming an e-fuse array.

FIG. 2 is a circuit diagram of a conventional cell array 200 including e-fuses.

Referring to FIG. 2, the cell array 200 includes memory cells 201 to 216 that are arrayed in N rows and M columns. The memory cells 201 to 216 include memories M1 to M16 and switches S1 to S16, respectively. The memories M1 to M16 are e-fuses having characteristics of either a resistor or a capacitor based on whether rupturing has occurred or not. In other words, the e-fuses M1 to M16 may be regarded as resistive memories for storing data according to the value of resistance. The switches S1 to S16 electrically connect the memories M1 to M16 with the switches S1 to S16 under the control of word line gate lines WLR1 to WLRN.

Hereafter, it is assumed that a second row is a selected row and an $M^{th}$ column is a selected column. In other words, it is assumed that a memory cell 208 is a selected memory cell. Voltages supplied to the selected memory cell 208 and unselected memory cells 201 to 207 and 209 to 216 during a program/read operation are described below.

Program Operation

A word line gate line WLR2 of the selected row is enabled and the other word line gate lines WLR1 and WLR3 to WLRN are disabled. As a result, switches S5 to S8 are turned on, and the switches S1 to S4 and S9 to S16 are turned off. A high voltage level that could destroy a gate oxide of an e-fuse (which is generally a high voltage generated by pumping a power source voltage) is supplied to the program gate line WLP2 of the selected row, and a low-level voltage such as a ground voltage is supplied to the other program gate lines WLP1 and WLP3 to WLPN. The selected bit line BLM is coupled with a data access circuit, and the unselected bit lines BL1 to BLM-1 float. The data access circuit drives the selected bit line BLM with a low-level voltage, and programs or ruptures a memory M8 of the selected memory cell 208, when an inputted data is a program data, e.g., '1'. When an inputted data is not a program data, for example, when the inputted data is '0', the data access circuit drives the selected bit line BLM with a high-level voltage and does not program the memory M8 of the selected memory cell 208. Because the unselected bit lines BL1 to BLM-1 float, the memories M5 to M7 are not programmed even with a high voltage that is supplied to a gate.

Read Operation

The word line gate line WLR2 of the selected row is enabled, and the other word line gate lines WLR1 and WLR3 to WLRN are disabled. As a result, switches S5 to S8 are turned on, and the switches S1 to S4 and S9 to S16 are turned off. An appropriate level of voltage for a read operation, which is generally a power source voltage, is supplied to a program gate line WLP2 of the selected row, and a low-level voltage such as a ground voltage is supplied to the other program gate lines WLP1 and WLP3 to WLPN. The selected bit line BLM is coupled with a data access circuit, and the unselected bit lines BL1 to BLM-1 float. The data access circuit (not shown) recognizes that the memory M8 is programmed, when current flows through the selected bit line BLM. In other words, the data access circuit recognizes that the data of the selected memory cell 208 is '1' When no current flows through the selected bit line BLM, the data access circuit recognizes that the memory M8 is not programmed. In short, the data access circuit recognizes the data of the selected memory cell 208 as '0'.

Herein, one bit line BLM is selected among the multiple bit lines BL1 to BLM for the purpose of illustration, but a plurality of bit lines may be selected at one time in short, a plurality of memory cells belonging to one row may be programmed/read simultaneously.

SUMMARY

Exemplary embodiments of the present invention are directed to an optimal cell array structure in an e-fuse array circuit.

In accordance with an embodiment of the present invention, an e-fuse array circuit includes a program gate line and a word line gate line that are stretched in parallel to each other, and a metal line formed over the program gate line and the word line gate line to cover the program gate line and the word fine gate line, the metal line connected to the program gate fine through a plurality of contact plugs disposed at a given distance.

The e-fuse array circuit further includes an inter-layer dielectric layer formed over the program gate line and the word line gate line. The e-fuse array circuit further includes: a plurality of e-fuse transistors configured to receive a voltage of the program gate line through gates of the e-fuse transistors, and a plurality of selection transistors configured to be serially coupled with the e-fuse transistors, respectively, and receive a voltage of the word line gate line through gates of the selection transistors.

DETAILED DESCRIPTION

Figure 1:
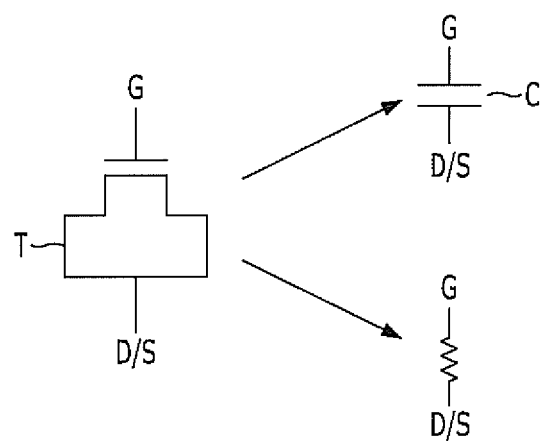
FIG. 1 is schematic diagram illustrating an e-fuse formed of a transistor, the e-fuse operating as a resistor or a capacitor.
Figure 2:
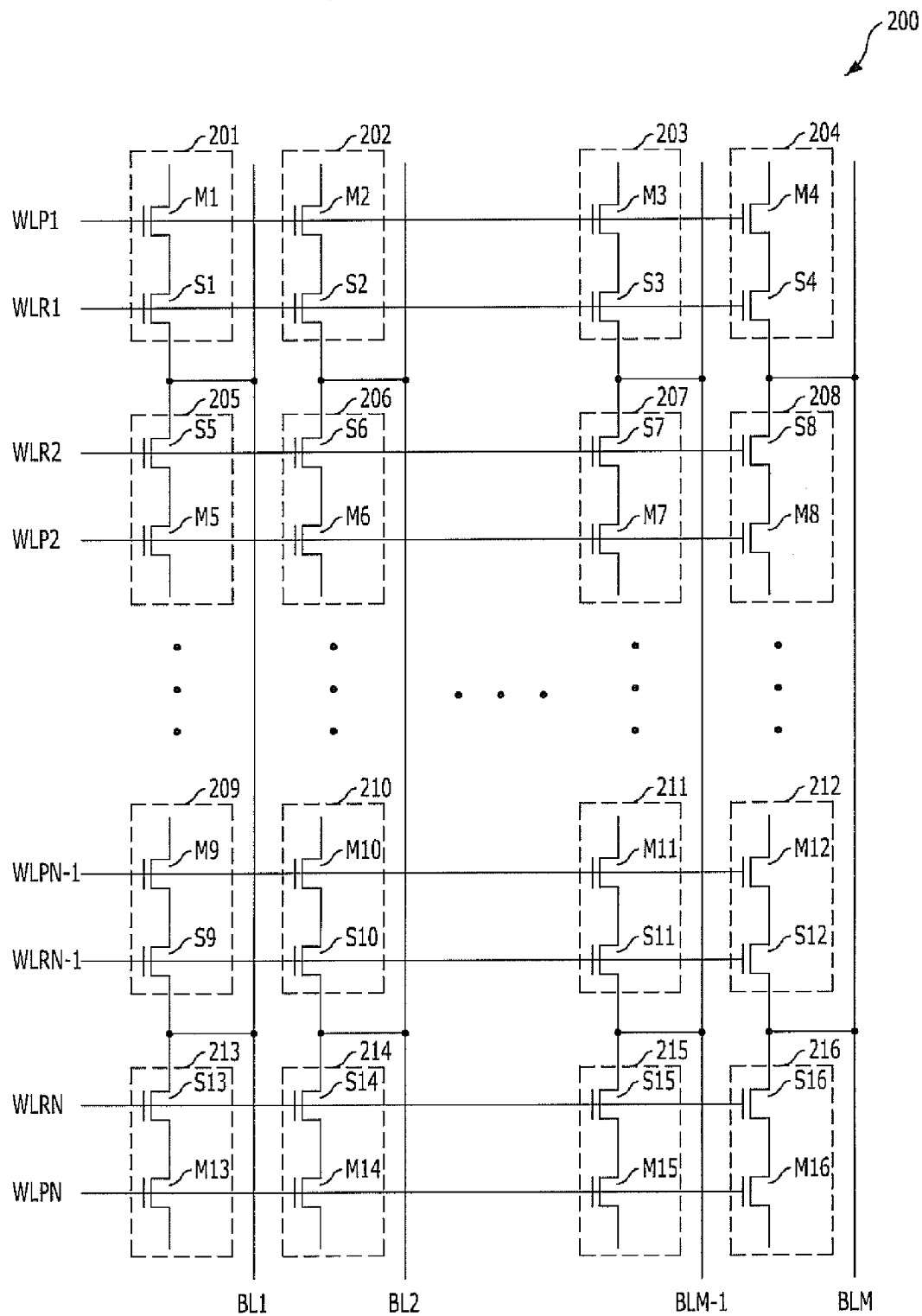
FIG. 2 is a block view illustrating a conventional cell array 200 including e-fuses.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
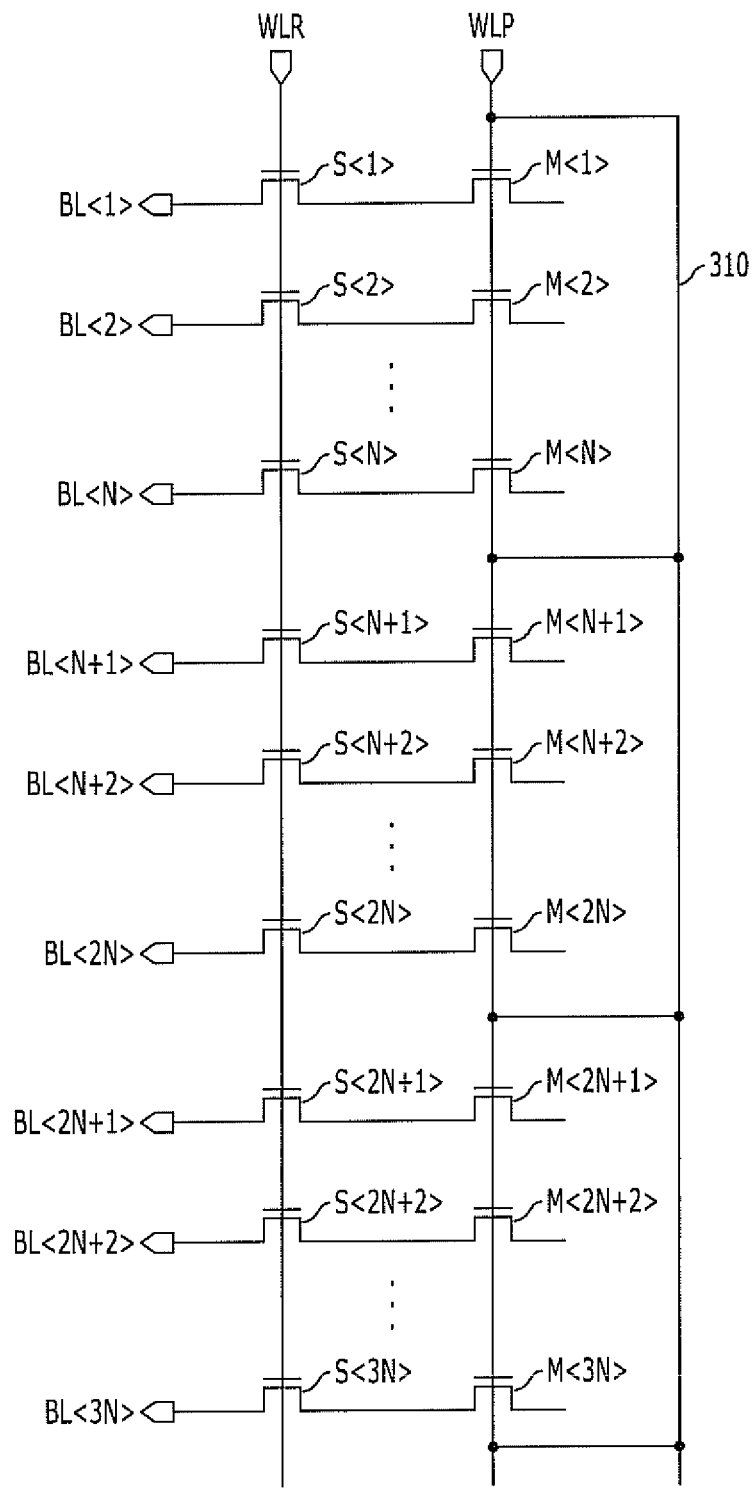
FIG. 3 is a block view illustrating an e-fuse array circuit in accordance with an embodiment of the present invention.

FIG. 3 is a block view illustrating an e-fuse array circuit in accordance with an embodiment of the present invention.

Referring to FIG. 3, a cell array of an e-fuse array circuit includes a plurality of e-fuse transistors M<1> to M<3N>, a plurality of selection transistors S<1> to S<3N>, a program gate line WLP, word line gate line WLR, and a metal line 310.

The e-fuse transistors M<1> to M<3N> operate as memories, and store a data of '0' or '1' based on whether a gate oxide is destroyed or not. The gates of the e-fuse transistors M<1> to M<3N> may be controlled by the program gate line WLP.

The selection transistors S<1> to S<3N> are serially coupled with the e-fuse transistors M<1> to M<3N>, respectively. When the selection transistors S<1> to S<3N> are turned on, the selection transistors S<1> to S<3N> electrically connect the corresponding e-fuse transistors M<1> to M<3N> with bit lines BL<1> to BL<3N>. The gates of the selection transistors S<1> to S<3N> may be controlled by the word line gate line WLR.

The metal line 310 is a line for metal-strapping of the program gate line WLP. The metal line 310 may be electrically connected with the program gate line WLP at a plurality of nodes, and a predetermined number N of e-fuse transistors may be disposed between the nodes.

When the e-fuse array circuit performs a program operation, a high voltage that could destroy the gate oxide of the e-fuse transistors M<1> to M<3N> is supplied to the program gate line WLP. In other words, a great deal of current is supplied to the program gate line WLP. Since the metal line 310 metal-straps the program gate line WLP, the high voltage may be efficiently supplied to the program gate line WLP. Meanwhile, because the word line gate line WLR requires a voltage level that may turn on/off the selection transistors S<1> to S<3N>, the metal-strapping of the word line gate line WLR may not be necessary.

The e-fuse array circuit according to the embodiment of the present invention operates similarly as a conventional e-fuse array circuit. Because the operation of the conventional e-fuse array circuit is already described in the Description of the Related Art, further description on that matter is not provided herein.

Figure 4:
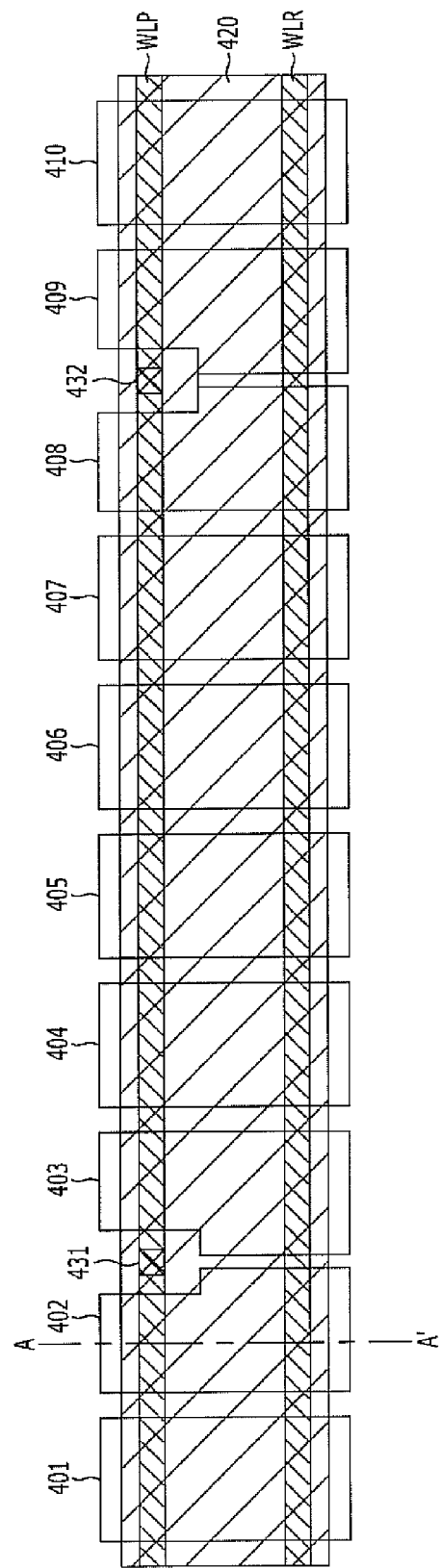
FIG. 4 is an illustration of a layout of FIG. 3.

FIG. 4 is an illustration of a layout of FIG. 3.

The FIG. 4 shows an exemplary layout of 10 e-fuse transistors and 10 selection transistors corresponding to 10 selection transistors among the multiple e-fuse transistors and the multiple selection transistors.

Referring to FIG. 4, the e-fuse transistors and the selection transistors are formed in active regions 401 to 410, respectively. The gates of the e-fuse transistors are coupled with the program gate line WLP that may be formed of polysilicon, whereas the gates of the selection transistors are coupled with the word line gate line WLR that may be formed of polysilicon as well.

A metal line 420 is formed to overlap with the regions of a program gate line WLP and a word line gate line WLR. Based on another embodiment of the present invention, the metal line 420 may be formed to cover the upper portions of the program gate line WLP and the word line gate line WLR. The metal line 420 is electrically connected with the program gate line WLP through contact plugs 431 and 432.

The contact plugs 431 and 432 may electrically connect the metal line 420 with the program gate line WLP in the regions other than the active regions 401 to 410. The contact plugs 431 and 432 may be formed to electrically connect the metal line 420 with the program gate line WLP in the active regions 401 to 410. Meanwhile, portions of the e-fuse transistors in the active regions 402, 403, 408 and 409 that are adjacent to the contact plugs 431 and 432 may be formed narrower than the other portion of the e-fuse transistors in the other active regions 401, 404 to 407, and 410. Herein, the e-fuse transistors of the active regions 402, 403, 408 and 409 that are adjacent to the contact plugs 431 and 432 may be dummy active regions, which are not actually used. An irregular pattern may be formed in the portion where contacts are formed by the contact plugs 431 and 432. The dummy active regions 402, 403, 408 and 409 exist to prevent the irregular pattern from formed.

Figure 5:
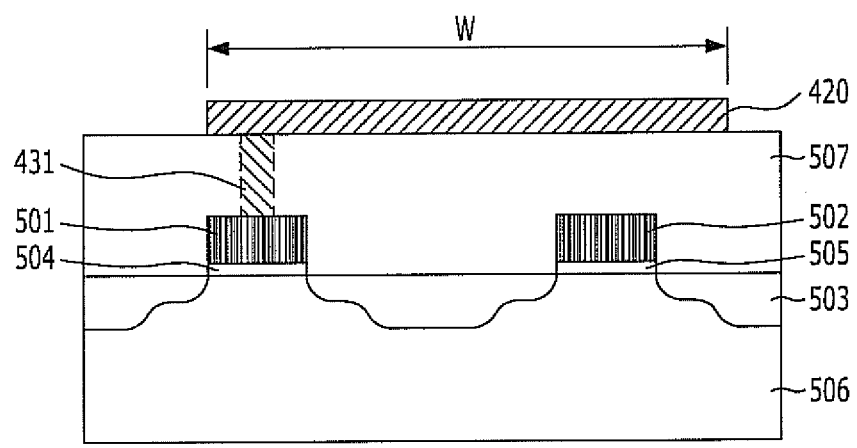
FIG. 5 is a cross-sectional view of an A-A' cross-section shown in FIG. 4.

FIG. 5 is a cross-sectional view of an A-A' cross-section shown in FIG. 4.

Referring to FIG. 5, the metal line 420 is formed to have a width W that is sufficiently wide to cover the program gates 501 of the e-fuse transistors and the word line gates 502 of the selection transistors. The contact plug 431 may electrically connect the program gates 501 of the e-fuse transistors, which are the program gate line WLP, with the metal line 420. For example, the contact plug 431 may be directly coupled with the program gates 501 of the e-fuse transistors, or the contact plug 431 may be directly coupled with the program gate line WLP that couples the program gates 501 of the e-fuse transistors. Although the drawing illustrates that the contact plug 431 and the program gates 501 of the e-fuse transistors may be disposed on the same cross-section for the sake of convenience in description, they may be disposed on different cross-sections, as illustrated in FIG. 4.

In FIG. 5, a reference numeral '503' denotes a drain/source region, and reference numerals '504' and '505' denote gate oxide. A reference numeral '506' denotes a substrate, and a reference numeral '507' denotes an inter-layer dielectric layer between the gates 501 and 502 and the metal line 420.

Referring to FIG. 5, metal-strapping by using the metal line 420 may occur only in an e-fuse program gate line, and the metal line 420 may be formed to have a sufficiently wide width W. Therefore, a high voltage may be efficiently supplied through the e-fuse program gate line WLP.

According to the exemplary embodiment of the present invention, the program gate line may be selectively metal-strapped between the program gate line and the word line gate line of an e-fuse array circuit. Also, because the area of the metal lines for metal-strapping may be increased by using the upper regions of the word line gate line that is not metal-strapped, a sufficient amount of current may be supplied to the program gate line.

While the present invention has been described with respect to the specific embodiments, it will be apparent to those skilled in the art that various changes and modifications may be made without departing from the spirit and scope of the invention as defined in the following claims.

What is claimed is:

1. An e-fuse array circuit, comprising:
   a program gate line and a word line gate line that are stretched in parallel to each other;
   a metal line formed over the program gate line and the word line gate line to cover the program gate line and the word line gate line, the metal line connected to the program gate line through a plurality of contact plugs disposed at a given distance;
   a plurality of e-fuse transistors configured to receive a voltage of the program gate line through gates of the e-fuse transistors; and
   a plurality of selection transistors configured to be serially coupled with the e-fuse transistors, respectively, and receive a voltage of the word line gate line through gates of the selection transistors.

2. The e-fuse array circuit of claim 1, further comprising:
   an inter-layer dielectric layer formed over the program gate line and the word line gate line.

3. The e-fuse array circuit of claim 1, wherein the e-fuse transistors that are adjacent to the one or more contact plugs among the multiple e-fuse transistors have a smaller active area than the other e-fuse transistors.

4. The e-fuse array circuit of claim 3, wherein the e-fuse transistors that are adjacent to the one or more contact plugs are dummies.

5. The c-fuse array circuit of claim 1, wherein the program gate line and the word line gate line are formed of polysilicon.

6. The e-fuse array circuit of claim 1, wherein the one or more contact plugs are formed over an upper portion of a region other than the active regions of the multiple e-fuse transistors.

* * * * *